(12) United States Patent
Ohsawa et al.

(10) Patent No.: US 7,652,890 B2
(45) Date of Patent: Jan. 26, 2010

(54) WIRED CIRCUIT BOARD

(75) Inventors: Tetsuya Ohsawa, Osaka (JP); Katsutoshi Kamei, Osaka (JP)

(73) Assignee: Nitto Denko Corporation, Osaka (JP)

(*) Notice: Subject to any disclaimer, the term of this patent is extended or adjusted under 35 U.S.C. 154(b) by 0 days.

(21) Appl. No.: 12/289,437

(22) Filed: Oct. 28, 2008

(65) Prior Publication Data

US 2009/0151994 A1 Jun. 18, 2009

Related U.S. Application Data

(60) Provisional application No. 60/996,753, filed on Dec. 4, 2007.

(30) Foreign Application Priority Data

Nov. 21, 2007 (JP) .............................. 2007-302026

(51) Int. Cl.
*H05K 1/00* (2006.01)
(52) U.S. Cl. ................. 361/749; 361/776; 361/777; 361/803; 174/254
(58) Field of Classification Search ......... 361/749–750; 174/254–258; 360/245.9
See application file for complete search history.

(56) References Cited

U.S. PATENT DOCUMENTS

| 6,399,899 | B1 * | 6/2002 | Ohkawa et al. ............. 174/261 |
| 6,420,659 | B1 * | 7/2002 | Tsutsumi et al. ............ 174/254 |
| 7,092,215 | B2 | 8/2006 | Someya et al. |
| 7,271,347 | B2 * | 9/2007 | Ohwaki ..................... 174/252 |
| 7,336,446 | B2 * | 2/2008 | Kanagawa et al. ........ 360/245.9 |

FOREIGN PATENT DOCUMENTS

JP 2004-133988 4/2004

* cited by examiner

*Primary Examiner*—Tuan T Dinh
(74) *Attorney, Agent, or Firm*—Jean C. Edwards, Esq.; Akerman Senterfitt

(57) ABSTRACT

A wired circuit board includes a wiring formation portion, a terminal formation portion, and a middle portion formed therebetween. The wiring formation portion includes a first conductive layer formed on a first insulating layer, and a second conductive layer formed on a second insulating layer so as to overlap the first conductive layer in a thickness direction. The terminal formation portion includes the first and second conductive layers formed in parallel in the same plane. The middle portion includes the first conductive layer formed on the first insulating layer, and the second conductive layer formed on a portion of the second insulating layer extending from the wiring formation portion to a mid-point between the wiring formation portion and the terminal formation portion, and formed on a portion of the first insulating layer extending from the mid-point to the terminal formation portion.

3 Claims, 7 Drawing Sheets

FIG. 6
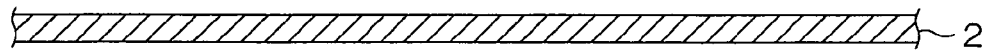
(a)
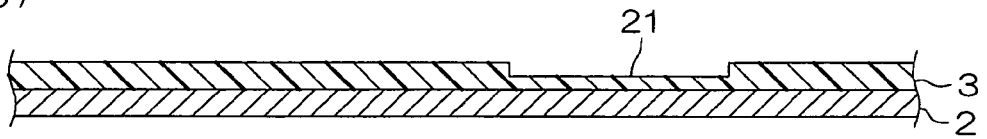
(b)
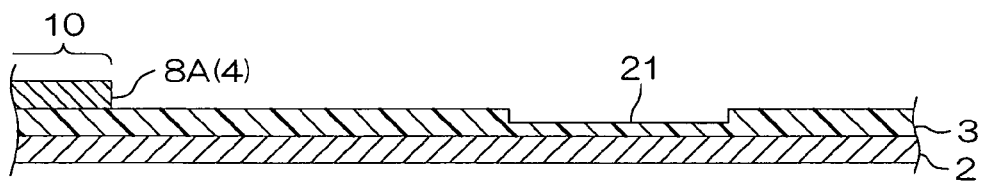
(c)
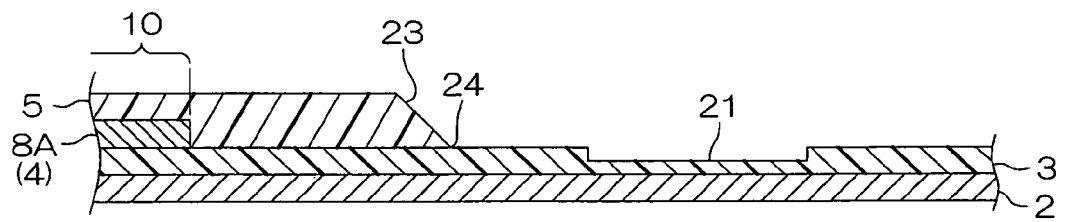
(d)
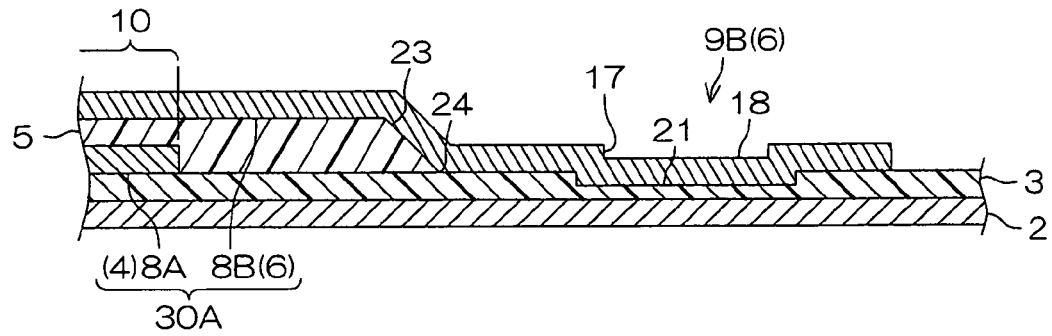
(e)

FIG. 7
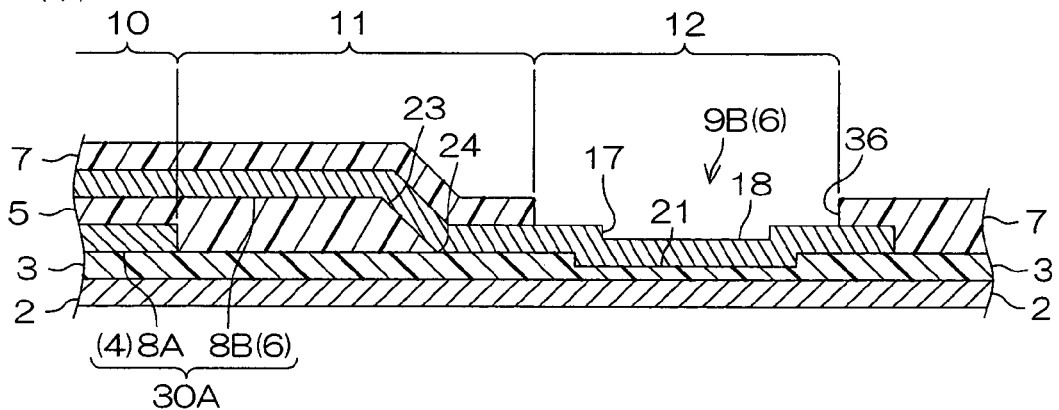
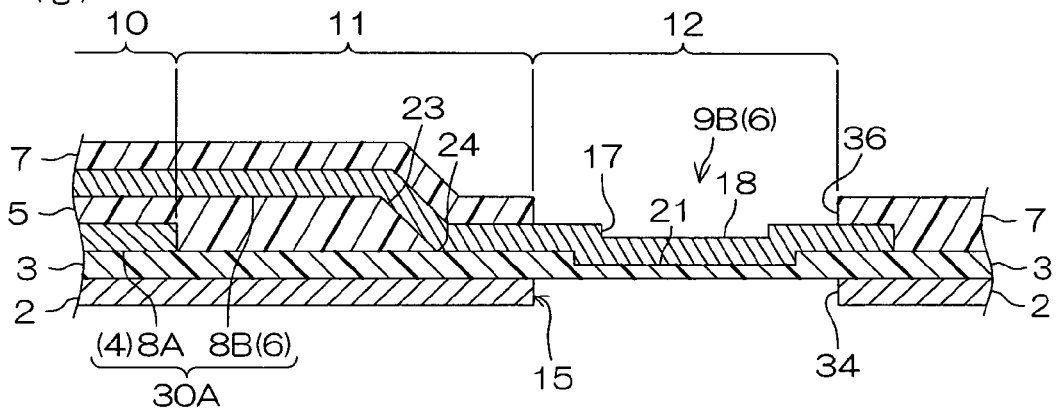
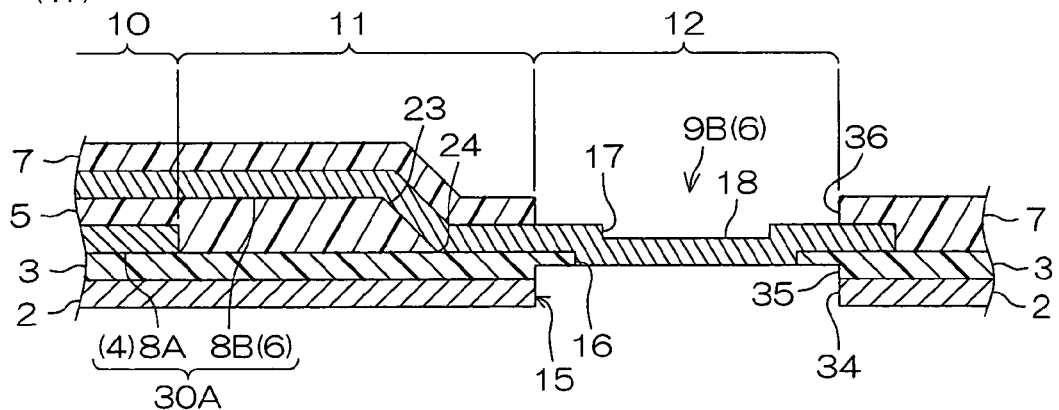

FIG. 8
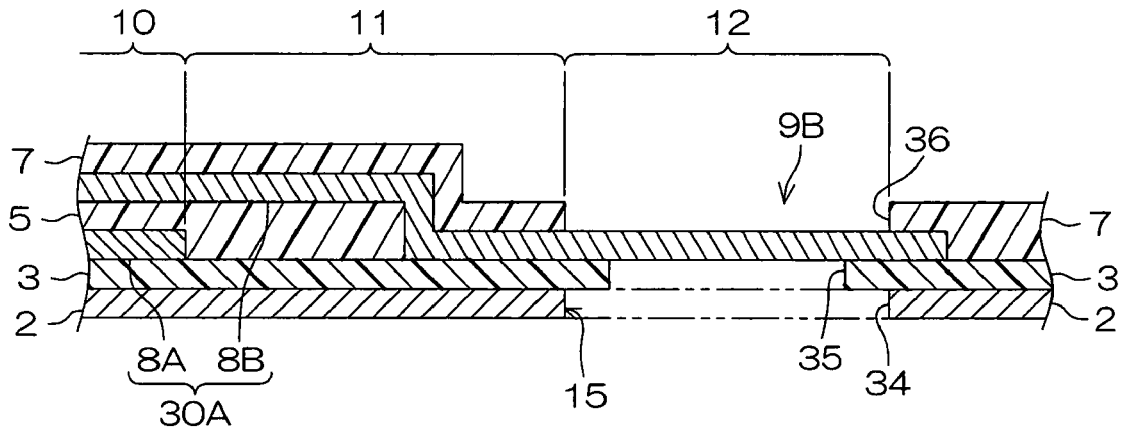
FIG. 9
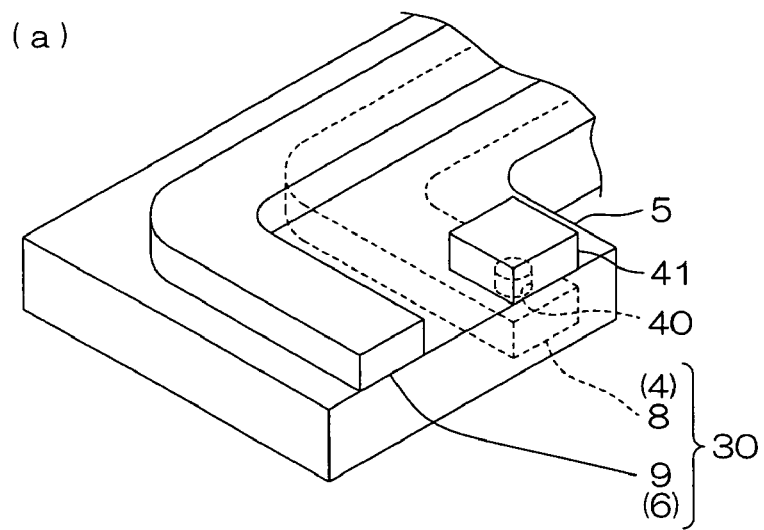
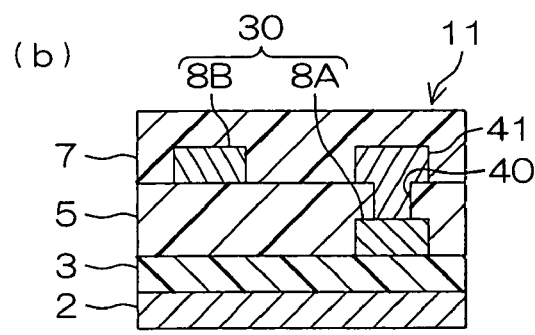

WIRED CIRCUIT BOARD

CROSS-REFERENCE TO RELATED APPLICATIONS

This application claims the benefit of U.S. Provisional Application No. 60/996,753, filed Dec. 4, 2007, and claims priority from Japanese Patent Application No. 2007-302026, filed Nov. 21, 2007, the contents of which are herein incorporated by reference in their entirety.

BACKGROUND OF THE INVENTION

1. Field of the Invention

The present invention relates to a wired circuit board and, more particularly, to a wired circuit board such as a suspension board with circuit or a flexible wired circuit board.

2. Description of the Related Art

In recent years, to respond to an increase in wiring density, it has been known to use a double-decker structure in which one wire and the other wire are disposed to oppose each other with an insulating layer interposed therebetween in a thickness direction as a wiring structure in a wired circuit board such as a suspension board with circuit or a flexible wired circuit board.

For example, a suspension for disk has been proposed in which, to suppress the occurrence of crosstalk in a conductive layer, a wiring portion includes a second layer (lower insulating layer) of an insulating layer, second conductors (a conductor for writing and a conductor for reading) formed on the second layer, a first layer (upper insulating layer) of the insulating layer formed on the second conductors to cover the second layer and the second conductors, and first conductors (a conductor for writing and a conductor for reading) formed on the first layer to oppose the second conductors in a thickness direction (see, e.g., Japanese Unexamined Patent Publication No. 2004-133988).

SUMMARY OF THE INVENTION

However, in a terminal portion of the suspension for disk proposed in Japanese Unexamined Patent Publication No. 2004-133988, terminals for connection to be connected to the second conductors, and one ends of the first conductors are disposed in parallel on the upper insulating layer in order to achieve easy connection to external terminals.

More specifically, in a middle portion between the wiring portion and the terminal portion, via holes are formed in the portions of the upper insulating layer corresponding to the second conductors, and through-hole plating portions are formed to fill in the via holes. On the upper insulating layer, the terminals for connection are formed to come in contact with the through-hole plating portions. As a result, the connection terminals and the one ends of the first conductors are disposed in parallel in the same plane on the upper insulating layer.

However, since the second conductors mentioned above are connected to the terminals for connection via the through-hole plating portions, the problem occurs in such a way that the impedance of the second conductors becomes unstable.

In addition, in the second conductors connected via the terminals for connection mentioned above, an interface is formed between the terminal for connection and the second conductor. This leads to the problem that a wire breakage is likely to occur at the interface.

Further, there is also the problem that, since the terminals for connection are formed, flexibility in designing the first and second conductors is impaired.

It is therefore an object of the present invention to provide a wired circuit board which allows easy connection to an external terminal as well as the stabilization of impedance, and also has excellent connection reliability as well as improved flexibility in designing a first conductive layer and a second conductive layer.

A wired circuit board of the present invention includes a wiring formation portion, a terminal formation portion, and a middle portion formed continuously between the wiring formation portion and the terminal formation portion, wherein the wiring formation portion includes a first insulating layer, a first conductive layer formed on the first insulating layer, a second insulating layer formed on the first insulating layer so as to cover the first conductive layer, and a second conductive layer formed on the second insulating layer so as to overlap the first conductive layer in a thickness direction, the terminal formation portion includes the first conductive layer and the second conductive layer formed in parallel in the same plane, and the middle portion includes the first insulating layer, the first conductive layer formed on the first insulating layer, the second insulating layer formed on the first insulating layer to cover the first conductive layer, extending from the wiring formation portion toward the terminal formation portion, and terminating at a mid-point between the wiring formation portion and the terminal formation portion, and the second conductive layer formed on a portion of the second insulating layer extending from the wiring formation portion to the mid-point, and formed on a portion of the first insulating layer extending from the mid-point to the terminal formation portion.

In the wired circuit board of the present invention, it is preferable that, in a portion of the middle portion opposing the second conductive layer, an end surface of the second insulating layer is inclined to be gradually closer to the first insulating layer as it extends from the wiring formation portion toward the terminal formation portion.

In the wired circuit board of the present invention, it is preferable that the wired circuit board is a suspension board with circuit.

In the wiring formation portion of the wired circuit board of the present invention, the second conductive layer overlaps the first conductive layer in the thickness direction. As a result, it is possible to stabilize impedance.

Additionally, in the terminal formation portion, the first conductive layer and the second conductive layer are formed in the same plane. This allows easy connection to an external terminal.

Further, in the middle portion, the second conductive layer is formed on the portion of the second insulating layer extending from the wiring formation portion to the mid-point between the wiring formation portion and the terminal formation portion, and formed continuously on the portion of the first insulating layer extending from the mid-point to the terminal formation portion. As a result, it is possible to stabilize impedance in the wiring formation portion, and achieve easy connection to the external terminal in the terminal formation portion. This allows both the stabilization of impedance and the easy connection to the external terminal.

Moreover, a terminal for connecting the first conductive layer is not needed in the middle portion, and a first external terminal portion and a second external terminal portion are formed in the same plane in the terminal formation portion. Accordingly, it is possible to prevent a wire breakage in the middle portion, and ensure excellent thermal shock resistance. As a result, excellent connection reliability can be obtained.

Furthermore, since it is not necessary to provide a terminal for connection, flexibility in designing the first conductive layer and the second conductive layer can be improved.

BRIEF DESCRIPTION OF THE DRAWINGS

FIG. 6 is a process view for illustrating a producing method of the suspension board with circuit, (a) showing the step of preparing a metal supporting layer,
(b) showing the step of forming a first insulating base layer,
(c) showing the step of forming a first conductive layer,
(d) showing the step of forming a second insulating base layer, and
(e) showing the step of forming a second conductive layer;

FIG. 7 is a process view for illustrating, subsequently to FIG. 6, the producing method of the suspension board with circuit shown in FIG. 2, (f) showing the step of forming an insulating cover layer,
(g) showing the step of opening the metal supporting layer to form a support opening, and
(h) showing the step of opening the first insulating base layer to form a base opening;

FIG. 8 is an enlarged cross-sectional view of a rear end portion of a suspension board with circuit according to another embodiment of the wired circuit board of the present invention along a second wire; and FIG. 9 shows a suspension board with circuit of COMPARATIVE EXAMPLE 1, (a) showing an enlarged perspective view of a second wire in a rear end portion, and
(b) showing a cross-sectional view of a middle portion.

DETAILED DESCRIPTION OF THE INVENTION

Figure 1:
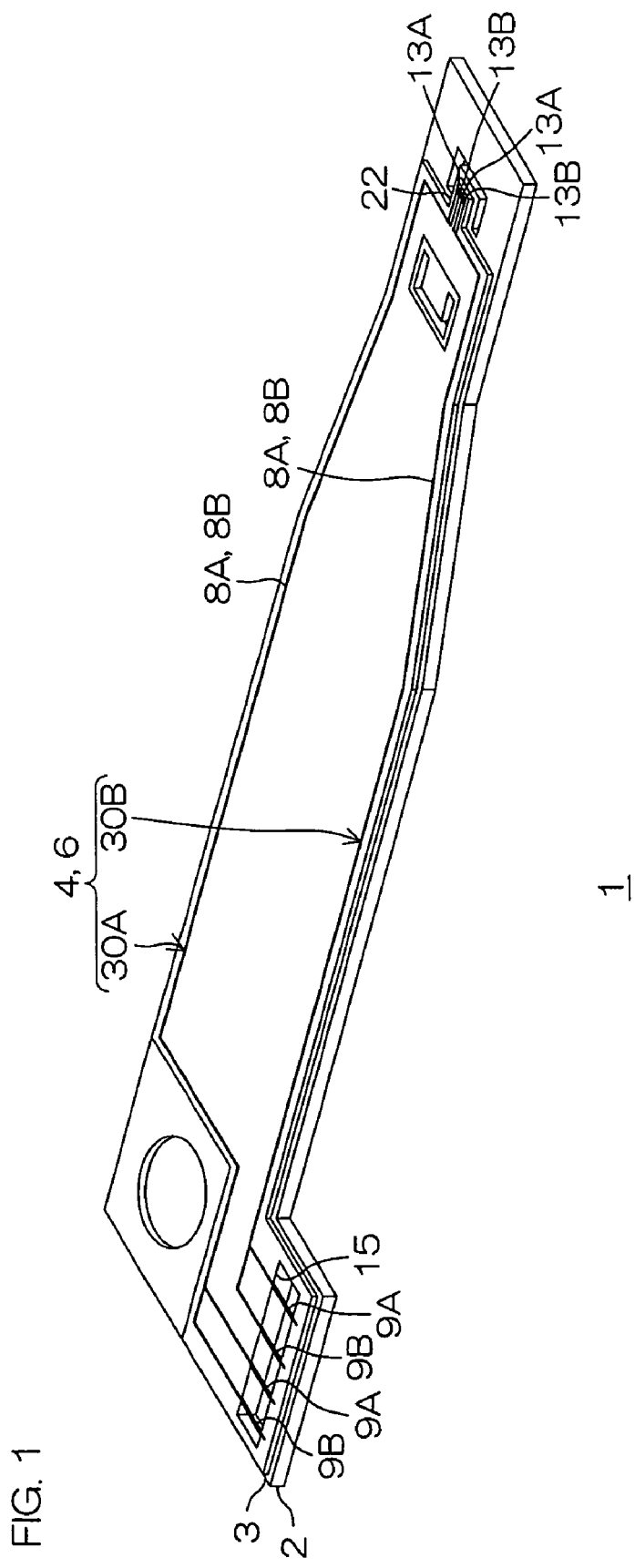
FIG. 1 is a perspective view of a suspension board with circuit according to an embodiment of a wired circuit board of the present invention.
Figure 2:
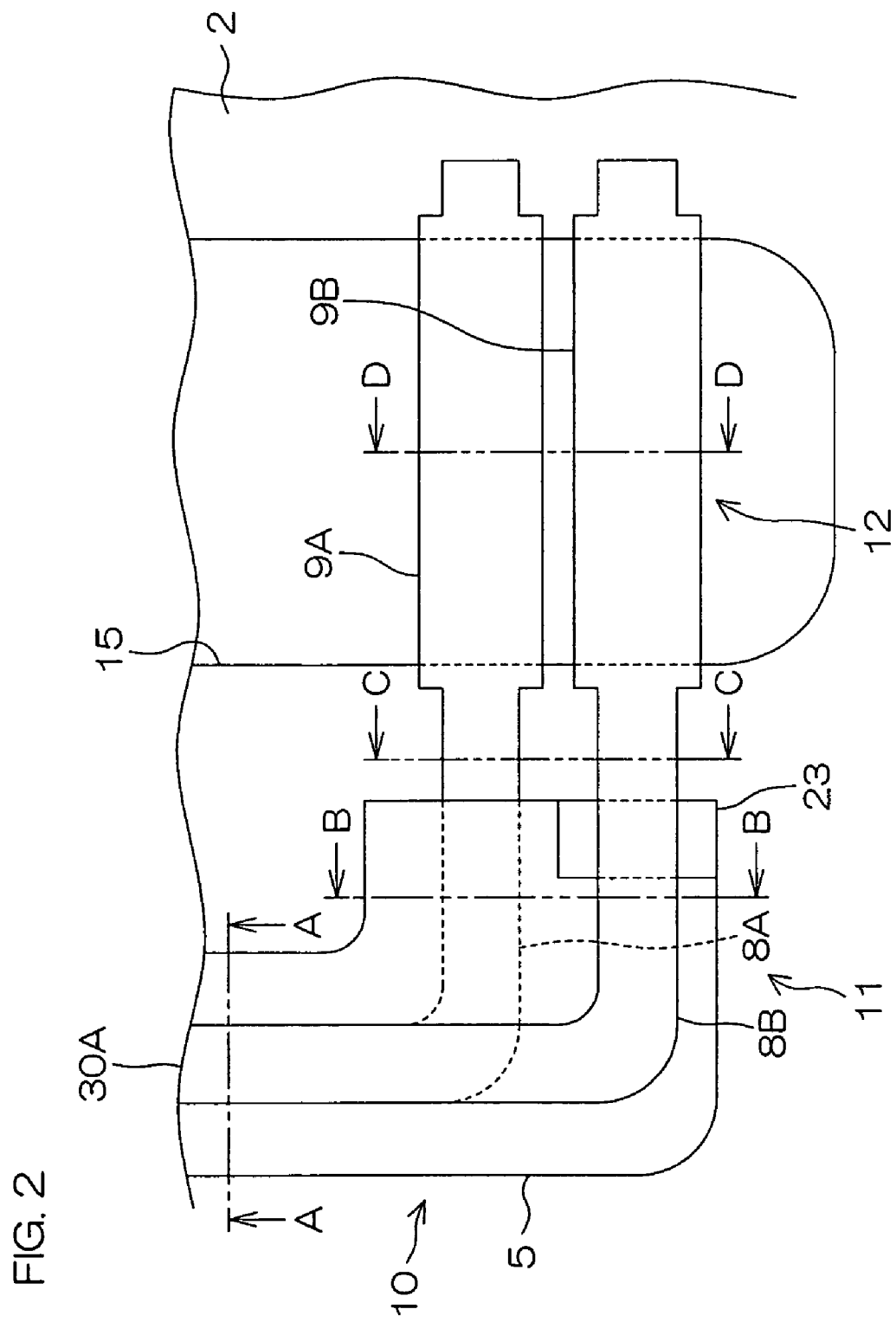
FIG. 2 is an enlarged plan view of a rear end portion of the suspension board with circuit shown in FIG. 1.
Figure 3:
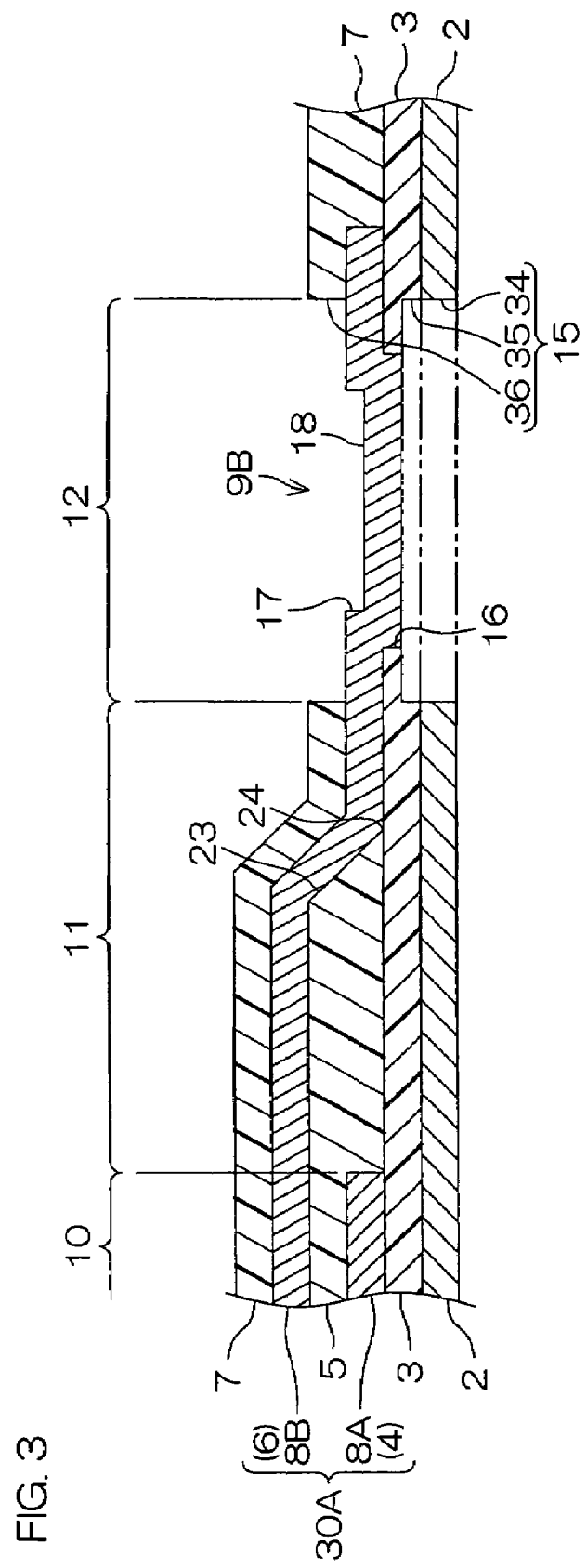
FIG. 3 is an enlarged cross-sectional view of the rear end portion shown in FIG. 2 along a second wire.
Figure 4:
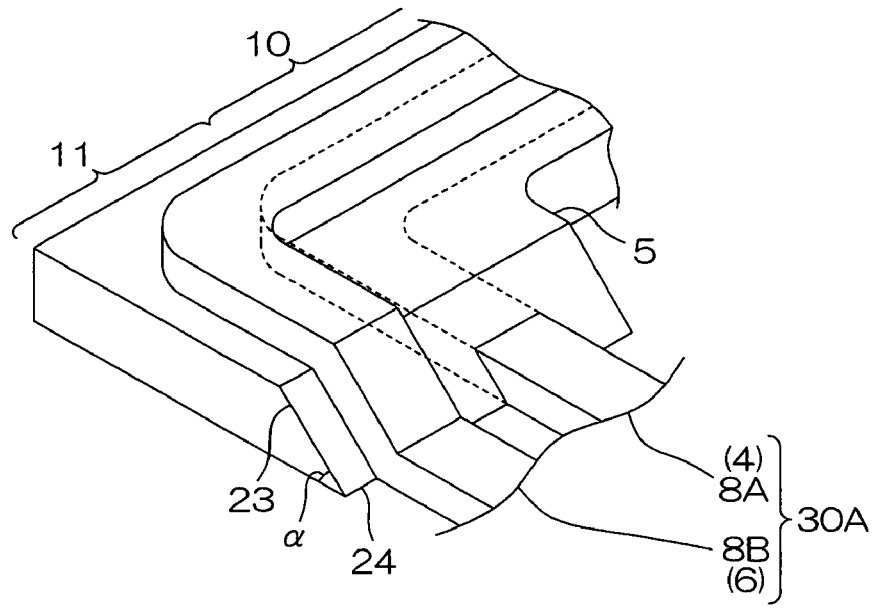
FIG. 4 is an enlarged perspective view of the rear end portion shown in FIG. 2.
Figure 5:
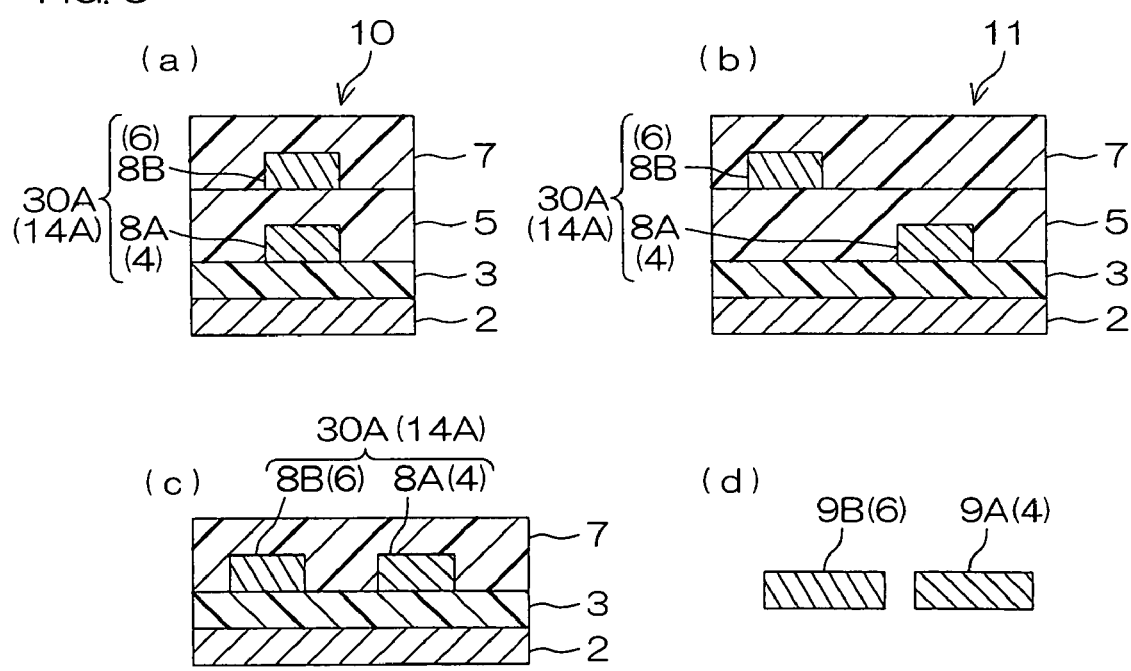
FIG. 5 is an enlarged cross-sectional view of the rear end portion shown in FIG. 2, (a) showing a cross-sectional view along the line A-A of FIG. 2,
(b) showing a cross-sectional view along the line B-B of FIG. 2,
(c) showing a cross-sectional view along the line C-C of FIG. 2, and
(d) showing a cross-sectional view along the line D-D of FIG. 2.

FIG. 1 is a perspective view of a suspension board with circuit according to an embodiment of a wired circuit board of the present invention. FIG. 2 is an enlarged plan view of a rear end portion of the suspension board with circuit shown in FIG. 1. FIG. 3 is an enlarged cross-sectional view of the rear end portion shown in FIG. 2 along a second wire. FIG. 4 is an enlarged perspective view of the rear end portion shown in FIG. 2. FIG. 5 is an enlarged cross-sectional view of the rear end portion shown in FIG. 2, (a) showing a cross-sectional view along the line A-A of FIG. 2, (b) showing a cross-sectional view along the line B-B of FIG. 2, (c) showing a cross-sectional view along the line C-C of FIG. 2, and (d) showing a cross-sectional view along the line D-D of FIG. 2. FIGS. 6 and 7 are process views for illustrating a producing method of the suspension board with circuit.

In FIG. 1, a second insulating base layer 5 and an insulating cover layer 7, each described later, are omitted for clear illustration of relative positioning of a first conductive layer 4 and a second conductive layer 6 to a metal supporting layer 2. In FIG. 4 also, the metal supporting layer 2, a first insulating base layer 3, and the insulating cover layer 7 are omitted for clear illustration of relative positioning of the first conductive layer 4 and the second conductive layer 6 to the second insulating base layer 5.

In FIG. 1, in the suspension board with circuit 1, the metal supporting layer 2 extending in a longitudinal direction is integrally formed with the first conductive layer 4 and the second conductive layer 6 each for electrically connecting a magnetic head and a read/write board, each not shown, which are supported by the metal supporting layer 2.

The metal supporting layer 2 is made of a metal foil in a flat plate shape or a metal thin plate, and has a gimbal 22 for mounting the magnetic head, not shown, which is formed in a front end portion thereof.

The first conductive layer 4 and the second conductive layer 6 are provided as a pair of wires (wire pair 30). To either one of the pair of wires, a read signal is inputted, while a write signal is inputted to the other wire. In the suspension board with circuit 1, two wire pairs 30 are provided. That is, the two wire pairs 30 are provided respectively on both sides in a widthwise direction (perpendicular to the longitudinal direction) of the suspension board with circuit 1 in a wiring formation portion 10 described later.

In the wire pair 30A (one wire pair) on one widthwise side, or the wire pair 30B (the other wire pair) on the other widthwise side, the first conductive layer 4 integrally includes first head-side terminal portions 13A for connecting to the connection terminals of the magnetic head, first external terminal portions 9A for connecting to the connection terminals (not shown) of the read/write board, and first wires 8A for connecting the first head-side terminal portions 13A and the first external terminal portions 9A. On the other hand, the second conductive layer 6 integrally includes second head-side terminal portions 13B for connecting to the connection terminals of the magnetic head, second external terminal portions 9B for connecting to the connection terminals (not shown) of the read/write board, and second wires 8B for connecting the second head-side terminal portions 13B and the second external terminal portions 9B.

Next, a detailed description is given to the rear end portion of the suspension board with circuit 1 with reference to FIGS. 2 to 5. In the following description, only the one wire pair 30A between the one wire pair 30A and the other wire pair 30B is described as an example. As for the other wire pair 30B, it is the same as in the description of the one wire pair 30A so that the description thereof is omitted.

In FIGS. 2 to 4, the rear end portion of the suspension board with circuit 1 is integrally provided with the wiring formation portion 10, a terminal formation portion 12, and a middle portion 11 formed continuously between the wiring formation portion 10 and the terminal formation portion 12.

In the wiring formation portion 10, the first insulating base layer 3 as a first insulating layer is formed on the metal supporting layer 2, as shown in FIGS. 4 and 5(a). The first insulating base layer 3 is uniformly laminated on the upper surface of the metal supporting layer 2.

The first wire 8A is formed on the first insulating base layer 3. As shown in FIGS. 1 and 4, the first wire 8A is formed to linearly extend toward the front end portion of the suspension board with circuit 1.

As shown in FIGS. 4 and 5(a), the second insulating base layer 5 as a second insulating layer is also laminated on the first insulating base layer 3 so as to cover the first wire 8A.

The second wire 8B is formed on the second insulating base layer 5 so as to overlap the first wire 8A in the thickness direction (vertical direction).

The insulating cover layer 7 is also formed on the second insulating base layer 5 so as to cover the second wire 8B.

The wiring formation portion 10 is formed as a region corresponding to a portion where the first wire 8A and the second wire 8B, i.e., the wires forming the one wire pair 30A overlap each other in the thickness direction.

In the terminal formation portion 12, the first external terminal portion 9A and the second external terminal portion 9B are disposed in parallel in the same plane, as shown in FIGS. 2 and 5(d).

That is, in the terminal formation portion 12, the first external terminal portion 9A and the second external terminal portion 9B are disposed in parallel and spaced-apart relation in the longitudinal (front-to-rear) direction.

The first external terminal portion 9A is disposed frontwardly of the second external terminal portion 9B, and formed continuously to the rear end of the first wire 8A of the middle portion 11. The second external terminal portion 9B is disposed rearwardly of the first external terminal portion 9A, and formed continuously to the rear end of the second wire 8B of the middle portion 11. The first external terminal portion 9A and the second external terminal portion 9B are formed as quadrilateral lands wider than the first wire 8A and the second wire 8B, respectively.

As shown in FIG. 3, the terminal formation portion 12 is formed with an opening 15 extending through the metal supporting layer 2, the first insulating base layer 3, and the insulating cover layer 7 in the thickness direction.

That is, as shown in FIG. 1, the opening 15 is formed in a generally rectangular shape when viewed in plan view to include the one wire pair 30A and the other wire pair 30B. Specifically, as shown in FIG. 3, the opening 15 is formed of a support opening 34 opened in the metal supporting layer 2, a base opening 35 opened in the first insulating base layer 3 and located at the same position as the support opening 34, and a cover opening 36 opened in the insulating cover layer 7 and located at the same position as the support opening 34.

The first insulating base layer 3 is provided with projecting portions 16 both projecting longitudinally inwardly of the opening 15 from the upper-half portion in the thickness direction of the first insulating base layer 3. As a result, stepped portions 17 corresponding to the respective projecting portions 16, and a terminal depressed portion 18 depressed downwardly from the stepped portions 17 are formed in the first external terminal portion 9A and the second external terminal portion 9B.

With the opening 15, the first external terminal portion 9A and the second external terminal portion 9B are formed as flying leads having lower surfaces thereof exposed from the support opening 34 and the base opening 35, and upper surfaces thereof exposed from the cover opening 36 in a portion corresponding to the terminal depressed portion 18.

On the surfaces of the first external terminal portion 9A and the second external terminal portion 9B, metal plating layers not shown are formed as necessary.

In the opening 15 (specifically the cover opening 36), the terminal formation portion 12 is formed as a region corresponding to the portion where the first external terminal portion 9A and the second external terminal portion 9B are exposed.

In the middle portion 11, the first insulating base layer 3 is formed on the metal supporting layer 2, as shown in FIGS. 3, 5(b) and 5(c). The first insulating base layer 3 is uniformly laminated on the upper surface of the metal supporting layer 2. The first insulating base layer 3 of the middle portion 11 is formed continuously from the first insulating base layer 3 of the wiring formation portion 10, and formed continuously to the projecting portion 16 of the terminal formation portion 12.

The first wire 8A is formed on the first insulating base layer 3. As shown in FIG. 4, in the middle portion 11, the first wire 8A is formed in a generally L-shaped shape which is curved widthwise outwardly at a mid-point thereof when viewed in plan view. That is, as shown in FIGS. 3 and 4, the not-yet-curved portion of the first wire 8A which is linearly continued from the first wire 8A of the wiring formation portion 10 is formed in the same plane as the first wire 8A of the wiring formation portion 10, i.e., on the upper surface of the first insulating base layer 3. On the other hand, the already curved portion of the first wire 8A which is linearly continued from the first external terminal portion 9A of the terminal formation portion 12 is formed in the same plane as the first external terminal portion 9A.

The second insulating base layer 5 is laminated on the first insulating base layer 3 to cover the first wire 8A. The second insulating base layer 5 is provided to correspond to the first wire 8A and the second wire 8B. More specifically, the second insulating base layer 5 is uniformly formed in a generally L-shaped shape when viewed in plan view on the upper surface of the first insulating base layer 3 exposed from the first wire 8A so as to cover the first wire 8A. The second insulating base layer 5 is formed to extend from the wiring formation portion 10 toward the terminal formation portion 12 and terminate at a mid-point 24 between the wiring formation portion 10 and the terminal formation portion 12. The rear end surface (end surface of the terminal formation portion 12 side) of the second insulating base layer 5 is formed as an inclined surface 23.

The inclined surface 23 is downwardly inclined to be gradually closer to the first insulating base layer 3 as it extends from the wiring formation portion 10 toward the terminal formation portion 12. The angle (angle of inclination) α formed between the inclined surface 23 and the first insulating base layer 3 is in a range of, e.g., 0.35 to 85 degrees, or preferably 0.5 to 45 degrees.

In the middle portion 11, the second wire 8B is formed on the second insulating base layer 5, and on the first insulating base layer 3.

In the middle portion 11, the second wire 8B is formed in a generally L-shaped shape which is curved widthwise outwardly at a mid-point thereof when viewed in plan view. That is, as shown in FIG. 5(a), the not-yet-curved portion of the second wire 8B of the middle portion 11 which is linearly continued from the second wire 8B of the wiring formation portion 10 is disposed to overlap the first wire 8A of the middle portion 11 when viewed in plan view (when vertically projected). On the other hand, as shown in FIG. 5(b), the already curved portion of the second wire 8B of the middle portion 11 which is linearly continued to the second wire 8B of the terminal formation portion 12 is disposed rearwardly of the first wire 8A of the middle portion 11 when viewed in plan view. That is, in the middle portion 11, the first wire 8A is curved widthwise outwardly at a position frontward of the second wire 8B. As a result, the second wire 8B is disposed to overlap the entire not-yet-curved portion of the first wire 8A till reaching a mid-point in the not-yet-curved portion, and not to overlap the first wire 8A at the not-yet-curved portion rearward of the mid-point, and at the already curved portion.

The not-yet-curved portion of the second wire 8B, and the already curved portion thereof before reaching the inclined surface 23 are formed in the same plane as the second wire 8B of the wiring formation portion 10, i.e., on the surface of the second insulating base layer 5.

On the other hand, the already curved portion of the second wire 8B rearward of the inclined surface 23 and frontward of the terminal formation portion 12 is formed in the same plane as the first external terminal portion 9A, i.e., on the first insulating base layer 3.

The second wire 8B is formed such that the already curved portion frontward of the inclined portion 23 and rearward of the wiring formation portion 10 which is formed on the upper surface of the second insulating base layer 5 continues at the inclined surface 23 to the already curved portion rearward of the inclined surface 23 and frontward of the terminal formation portion 12 which is formed on the first insulating base layer 3. That is, the second wire 8B is formed to be downwardly inclined at the inclined surface 23 and gradually closer to the first insulating base layer 3 as it extends from the wiring formation portion 10 toward the terminal formation portion 12.

The insulating cover layer 7 is formed over the first insulating base layer 3 and the second insulating base layer 5 to cover the first wire 8A and the second wire 8B.

The insulating cover layer 7 is formed over the second insulating base layer 5 so as to cover the second wire 8B at the portion (mid-point 24 between the wiring formation portion 10 and the terminal formation portion 12) where the second insulating base layer 5 is formed, and formed over the first insulating base layer 3 so as to cover the first wire 8A and the second wire 8B at the portion (extending from the mid-point 24 to the terminal formation portion 12) where the first insulating base layer 3 is exposed from the second insulating base layer 5.

At the front end portion of the suspension board with circuit 1, the one wire pair 30A and the other wire pair 30B are disposed in parallel in the vicinity of the gimbal 22. That is, the first head-side terminal portion 13A and the second head-side terminal portion 13B of the one wire pair 30A, and the first head-side terminal portion 13A and the second head-side terminal portion 13B of the other wire pair 30B are disposed in parallel in the widthwise direction to provide the same structure as in the terminal formation portion 12 and the middle portion 11.

The middle portion (between the front end portion and the rear end portion) of the suspension board with circuit 1 has the same structure as that of the wiring formation portion 10.

Next, a description is given to a producing method of the suspension board with circuit 1 with reference to FIGS. 6 and 7.

First, as shown in FIG. 6(*a*), the metal supporting layer 2 is prepared in the method. Examples of a metal material used to form the metal supporting layer 2 include stainless steel and 42-alloy. Preferably, stainless steel (e.g., SUS 304 according to the AISI (American Iron and Steel Institute) standard) or the like is used. The thickness of the metal supporting layer 2 is in a range of, e.g., 10 to 30 μm, or preferably 15 to 25 μm.

Next, as shown in FIG. 6(*b*), the first insulating base layer 3 is formed on the metal supporting layer 2 such that a base depressed portion 21 thinner than the other portion of the first insulating base layer 3 is formed.

Examples of an insulating material used to form the first insulating base layer 3 include synthetic resins such as a polyimide resin, a polyether nitrile resin, a polyether sulfone resin, a polyethylene terephthalate resin, a polyethylene naphthalate resin, and a polyvinyl chloride resin. Among them, a photosensitive synthetic resin is preferably used, or more preferably, a photosensitive polyimide resin is used.

To form the first insulating base layer 3, a solution (varnish) of a photosensitive synthetic resin is coated, and dried to provide a first base coating not shown. Then, the first base coating is exposed to light via a gradation exposure photomask not shown. The gradation photomask includes a light-shielding portion, a semi-light-transmitting portion, and a total-light-transmitting portion in a predetermined pattern. The total-light-transmitting portion, the semi-light-transmitting portion, and the light-shielding portion are disposed to respectively oppose the portion of the first base coating where the first insulating base layer 3 is to be formed, the portion thereof where the base depressed portion 21 is to be formed, and the portion thereof where the first insulating base layer 3 is not to be formed. Thereafter, the first base coating is developed, and cured as necessary to form the first insulating base layer 3 having the base depressed portion 21. In the formation of the first insulating base layer 3, the base depressed portion 21 can also be formed by, e.g, uniformly coating a solution (varnish) of the synthetic resin mentioned above on the entire upper surface of the metal supporting layer 2, drying the coated solution, curing it as necessary by heating, and then etching it.

The thickness of the first insulating base layer 3 thus formed is in a range of, e.g., 1 to 10 μm, or preferably 1 to 5 μm.

Next, as shown in FIG. 6(*c*), the first conductive layer 4 is formed in the foregoing pattern on the first insulating base layer 3.

Examples of a material used to form the first conductive layer 4 include metal materials such as copper, nickel, gold, a solder, and an alloy thereof. Among them, copper is preferably used.

To form the first conductive layer 4, a known patterning method such as, e.g., an additive method or a subtractive method is used. Preferably, the additive method is used.

In the additive method, a first metal thin film (seed film) not shown is formed first on the entire upper surface of the first insulating base layer 3. For the first metal thin film, a metal material such as copper, chromium, nickel, or an alloy thereof is used. The first metal thin film is formed by a thin-film formation method such as sputtering or plating. Preferably, the first metal thin film is formed by sputtering.

Next, a dry film resist is provided on the surface of the first metal thin film, exposed to light, and developed to form a plating resist, not shown, in a pattern reverse to the pattern of the first conductive layer 4. Subsequently, the first conductive layer 4 is formed on the surface of the first metal thin film exposed from the plating resist by electrolytic plating. Then, the plating resist and the portion of the first metal thin film where the plating resist is formed are removed by etching or the like.

The thickness of the first conductive layer 4 thus formed is in a range of, e.g., 3 to 50 μm, or preferably 5 to 15 μm. The width of the first wire 8A is in a range of, e.g., 10 to 300 μm, or preferably 15 to 150 μm. The width of the first external terminal portion 9A is in a range of, e.g., 10 to 15000 μm, or preferably 30 to 1000 μm.

In this manner, the first conductive layer 4 is formed in a wired circuit pattern integrally formed with the first wires 8A, the first external terminal portions 9A, and the first head-side terminal portions 13A.

Next, as shown in FIG. 6(d), the second insulating base layer 5 is formed in a pattern having the inclined surface 23 on the first insulating base layer 3.

As an insulating material for forming the second insulating base layer 5, the same insulating material as used to form the first insulating base layer 3 mentioned above is used.

To form the second insulating base layer 5, a solution (varnish) of a photosensitive synthetic resin is coated, and dried to provide a second base coating not shown. Then, the second base coating is exposed to light via a gradation exposure photomask not shown. The gradation exposure photomask includes a light-shielding portion, a semi-light-transmitting portion, and a total-light-transmitting portion in a predetermined pattern. The light transmittance of the semi-light-transmitting portion is set to be gradually higher with it extending from the light-shielding portion toward the total-light-transmitting portion. The total-light-transmitting portion, the semi-light-transmitting portion, and the light-shielding portion are disposed to respectively oppose the portion of the second base coating where the second insulating base layer 5 is to be formed, the portion thereof where the inclined surface 23 is to be formed, and the portion thereof where the second insulating base layer 5 is not to be formed. Thereafter, the second base coating is developed, and cured as necessary to form the second insulating base layer 5 having the inclined surface 23. In the formation of the second insulating base layer 5, the inclined surface 23 can also be formed by, e.g., uniformly coating a solution (varnish) of the synthetic resin mentioned above on the entire upper surface of the first insulating base layer 3 including the first wires 8A, drying the coated solution, curing it as necessary by heating, and then etching it.

The thickness of the second insulating base layer 5 thus formed is in a range of, e.g., 1 to 50 µm, or preferably 1.5 to 15 µm.

Next, as shown in FIG. 6(e), the second conductive layer 6 is formed in the foregoing pattern on the second insulating base layer 5.

As a material for forming the second conductive layer 6, the same material as used to form the first conductive layer 4 mentioned above is used.

To form the second conductive layer 6, the same patterning method as mentioned above is used. Preferably, the additive method is used.

In the additive method, a second metal thin film (seed film) not shown is formed first on the entire upper surfaces of the first insulating base layer 3 and the second insulating base layer 5. For the second metal thin film, the same metal material as mentioned above is used. The second metal thin film is formed by the same thin-film formation method. Preferably, the second metal thin film is formed by sputtering.

Next, a dry film resist is provided on the surface of the second metal thin film, exposed to light, and developed to form a plating resist not shown in a pattern reverse to the pattern of the second conductive layer 6. Subsequently, the second conductive layer 6 is formed on the surface of the second metal thin film exposed from the plating resist by electrolytic plating. Then, the plating resist and the portion of the second metal thin film where the plating resist is formed are removed by etching or the like.

The thickness of the second conductive layer 6 thus formed is in a range of, e.g., 3 to 50 µm, or preferably 5 to 15 µm. The width of the second wire 8B may be the same as or different from the width of the first wire 8A, and is in a range of, e.g., 10 to 300 µm, or preferably 15 to 150 µm.

The width of the second external terminal portion 9B is in a range of, e.g., 10 to 15000 µm, or preferably 30 to 1000 µm.

In the terminal formation portion 12, the spacing between the first external terminal portion 9A and the second external terminal portion 9B adjacent thereto is in a range of, e.g., 10 to 15000 µm, or preferably 15 to 1000 µm.

Next, as shown in FIG. 7(f), the insulating cover layer 7 is formed in a pattern having the cover opening 36 over the first insulating base layer 3 and the second insulating base layer 5.

As an insulating material for forming the insulating cover layer 7, the same insulating material as used to form the first insulating base layer 3 mentioned above is used.

To form the insulating cover layer 7, a solution (varnish) of a photosensitive synthetic resin is coated, and dried to provide a cover coating. Then, the cover coating is exposed to light via a photomask, and developed. Thereafter, the cover coating is cured as necessary to be formed in the pattern. Otherwise, the insulating cover layer 7 is formed by, e.g., uniformly coating a solution (varnish) of the synthetic resin mentioned above on the entire upper surfaces of the first insulating base layer 3 and the second insulating base layer 5, drying the coated solution, and then curing it as necessary by heating. The formation of the insulating cover layer 7 is not limited to the methods described above. For example, the insulating cover layer 7 can also be formed by preliminarily forming a synthetic resin into a film having the cover opening 36, and sticking the film to the surfaces of the first insulating base layer 3 and the second insulating base layer 5 via a known adhesive layer.

The thickness of the insulating cover layer 7 thus formed is in a range of, e.g., 2 to 10 µm, or preferably 3 to 6 µm.

Next, as shown in FIG. 7(g), the support opening 34 is formed by opening the metal supporting layer 2. Subsequently, as shown in FIG. 7(h), the base opening 35 is formed by opening the first insulating base layer 3 to form the opening 15. To open the metal supporting layer 2, wet etching such as, e.g., chemical etching is used. To open the first insulating base layer 3, dry etching such as, e.g., plasma etching using the metal supporting layer 2 as a mask is used. To leave the projecting portions 16 of the first insulating base layer 3, the lower half portion in the thickness direction of the first insulating base layer 3 is removed till the lower surfaces of the second external terminal portions 9B are exposed at the same position as that of the support opening 34.

In this manner, the first external terminal portions 9A and the second external terminal portions 9B can be formed as flying leads.

The length (longitudinal length) of the opening 15 is in a range of, e.g., 50 to 1500 µm. The length of the projecting portion 16 is in a range of, e.g., 10 to 1000 µm. The thickness of the projecting portion 16 is in a range of, e.g., 1 to 9 µm.

Then, the metal plating layers not shown are formed on the surfaces of the first external terminal portions 9A and the second external terminal portions 9B as necessary. The metal plating layers are made of a metal material such as gold. The metal plating layers are formed by plating such as, e.g., electrolytic plating or electroless plating. The thickness of the metal plating layer is in a range of, e.g., 0.2 to 5 µm. Likewise, metal plating layers are also formed on the surfaces of the first head-side terminal portions 13A and the second head-side terminal portions 13B.

Thereafter, the gimbal 22 is formed by trimming the metal supporting layer 2, whereby the suspension board with circuit 1 is obtained.

In the suspension board with circuit 1, the second wires 8B overlap the first wires 8A in the thickness direction in the wiring formation portion 10. As a result, it is possible to stabilize the impedance of each of the first wires 8A and the second wires 8B.

Additionally, in the terminal formation portion 12, the first external terminal portions 9A and the second external terminal portions 9B are formed in the same plane to provide the flying leads in which the top surfaces and back surfaces of the first external terminal portions 9A and the second external terminal portions 9B are exposed. This allows easy connection to the read/write board.

Further, in the middle portion 11, the second wires 8B are each formed on the portion of the second insulating base layer 3 extending from the wiring formation portion 10 to the mid-point 24 between the wiring formation portion 10 and the terminal formation portion 12, and formed continuously on the portion of the first insulating base layer 5 from the mid-point 24 to the terminal formation portion 12. As a result, it is possible to stabilize impedance in the wiring formation portion 10, and achieve easy connection to the read/write board in the terminal formation portion 12. This allows both the stabilization of impedance and the easy connection to the read/write board.

Moreover, a terminal for connecting the first conductive layer 4 is not needed in the middle portion 11, and the first external terminal portions 9A and the second external terminal portions 9B are formed in the same plane in the terminal formation portion 12. Accordingly, it is possible to prevent a wire breakage in the first conductive layer 4 in the middle portion 11, and ensure excellent thermal shock resistance in heating the suspension board with circuit 1 for mounting using a molten solder. As a result, excellent connection reliability can be obtained.

Furthermore, a terminal for connection need not be provided in the suspension board with circuit 1. That is, as shown in FIG. 9, it is typical practice to first form a via hole 40 in the second insulating base layer 5, and then fill the via hole 40 with a terminal for connection 41. In the case where such a terminal for connection 41 is provided, it is necessary to secure a region corresponding to the via hole 40 in the second insulating base layer 5, so that design flexibility is impaired.

To meet a higher-density requirement, it is also necessary to reduce the widths of the first wire 8A and the second wire 8B (to the order of, e.g., 20 µm). For the terminal for connection 41, it is necessary to secure a region of a certain size (the diameter of the bottom of a hole in a range of, e.g., 30 to 40 µm), but the region needs to be smaller than the width of the first wire 8A. Accordingly, it is difficult to achieve a higher density.

However, in the suspension board with circuit 1, such a terminal for connection 41 need not be provided. This allows an improvement in flexibility in designing the first conductive layer 4 and the second conductive layer 6, and further allows the achievement of a higher density.

In the description given above, the inclined surface 23 is formed at the rear end portion of the second insulating base layer 5 in the middle portion 11. However, it is also possible to, e.g., form the end surface of the rear end portion of the second insulating base layer 5 into a flat shape without providing the inclined surface 23, as shown in FIG. 8.

Preferably, the inclined surface 23 is formed. When the inclined surface 23 is formed, each of the second wires 8B gradually lowers at the rear end portion of the second insulating base layer 5 in the middle portion 11. Accordingly, it is possible to reduce stress concentration by distributing a stress exerted on the second wire 8B on the inclined surface 23, and prevent a wire breakage in the second wire 8B.

In the description given above, the rear end of the second insulating base layer 5 is formed at the mid-point 24 between the wiring formation portion 10 and the terminal formation portion 12, as shown in FIG. 3. However, in the middle portion 11, it is sufficient to allow the second wire 8B to be formed on the first insulating base layer 3. For example, the rear end of the second insulating base layer 5 can be formed at the rear end of the middle portion 11, though not shown. In this case also, the second wire 8B is formed on the first insulating base layer 3 at the rear end of the insulating base layer 5.

In the method described above, the base depressed portion 21 is formed in the insulating base layer 3 in the terminal formation portion 12, and the terminal depressed portion 18 is further formed to correspond to the base depressed portion 21. However, as shown in FIG. 8, it is also possible to form the insulating base layer 3 into a flat shape in the terminal formation portion 12, and form each of the first external terminal portion 9A and the second external terminal portion 9B into a flat shape. In this case, the first external terminal portion 9A and the second external terminal portion 9B are both formed in the same plane as the upper surface of the first insulating base layer 3.

Preferably, the base depressed portion 21 is formed. When the base depressed portion 21 is formed, it is possible to reduce an opening time (e.g., an etching time) required to open the first insulating base layer 3 since the base depressed portion 21 is thinner than the other portion of the first insulating base layer 3 as shown in FIG. 7(g), and increase production efficiency.

In the description given above, the first external terminal portion 9A and the second external terminal portion 9B are formed as the flying leads. However, as indicated by the phantom lines of FIG. 3, it is also possible to form the insulating base layer 3 and/or the metal supporting layer 2 under the first external terminal portion 9A and the second external terminal portion 9B.

In the description given above, the suspension board with circuit is illustrated as an example of the wired circuit board of the present invention. However, the wired circuit board of the present invention is not limited thereto. For example, it is also possible to form the wired circuit board of the present invention as a flexible wired circuit board which does not include the metal supporting board 2, though not shown.

EXAMPLES

The present invention is described more specifically by showing the example and the comparative example hereinbelow. However, the present invention is by no means limited to the example and the comparative example.

Example 1

First, a metal supporting layer made of a stainless steel (SUS 304) foil having a thickness of 25 µm was prepared (see FIG. 6(a)). Then, a varnish of a photosensitive polyamic acid resin was coated on the entire upper surface of the metal supporting layer, dried, and exposed to light via a gradation exposure photomask to form a first base coating. Subsequently, the first base coating was developed, and further cured by heating to form a first insulating base layer made of polyimide having a thickness of 3 µm (see FIG. 6(b)). In the first insulating base layer, a base depressed portion having a thickness of 1 µm was formed.

Then, a first conductive layer was formed on the insulating base layer by an additive method.

In the additive method, a chromium thin film having a thickness of 0.03 µm, and a copper thin film having a thickness of 0.07 µm were successively formed as a first metal thin film by chromium sputtering and copper sputtering on the entire upper surface of the first insulating base layer. Then, a plating resist in a pattern reverse to the patterns of the first conductive layer was formed on the surface of the first metal thin film. Then, the first conductive layer having a thickness of 10 μm was formed on the surface of the first metal thin film exposed from the plating resist by electrolytic copper plating. Then, the plating resist and the portion of the first metal thin where the plating resist was formed were removed by chemical etching (see FIG. 6(c)).

The width of each first wire was 50 μm. The width of each first external terminal portion was 280 μm.

Then, a varnish of a photosensitive polyamic acid resin was coated on the entire upper surface of the first insulating base layer including the first wires, dried, and then exposed to light via the gradation photomask mentioned above to form a second base coating. Subsequently, the second base coating was developed, and further cured by heating to form a second insulating base layer made of polyimide and having an inclined surface (see FIG. 6(d)). The angle of inclination of the inclined surface was 1.15 degrees.

Then, a second conductive layer was formed on the second insulating base layer by an additive method.

In the additive method, a chromium thin film having a thickness of 0.03 μm, and a copper thin film having a thickness of 0.07 μm were successively formed as a second metal thin film by chromium sputtering and copper sputtering on the entire upper surface of the second insulating base layer. Then, a plating resist in a pattern reverse to the pattern of the second conductive layer was formed on the surface of the second metal thin film. Then, the second conductive layer having a thickness of 10 μm was formed on the surface of the second metal thin film exposed from the plating resist by electrolytic copper plating. Then, the plating resist and the portion of the second metal thin film where the plating resist was formed were removed by chemical etching (see FIG. 6(e)).

Then, a varnish of a photosensitive polyamic acid resin was coated on the entire upper surfaces of the first insulating base layer and the second insulating base layer, dried, exposed to light, developed, and further cured by heating to form an insulating cover layer made of polyimide and having a thickness of 5 μm in a pattern formed with a cover opening (see FIG. 7(f)).

Then, a support opening was formed by opening the metal supporting layer by chemical etching (see FIG. 7(g)). Subsequently, a base opening was formed by opening the first insulating base layer by plasma etching to form an opening (see FIG. 7(h)). Thereafter, a gimbal was formed by trimming the metal supporting layer to provide a suspension board with circuit (see FIG. 1).

Comparative Example 1

A suspension board with circuit was obtained by the same method as used in EXAMPLE 1 except that, in the formation of the second insulating base layer, a via hole (40) with a bottom having a diameter of 40 μm was formed at a widthwise outer position in a rear end portion of the second insulating base layer in opposing relation to the first wire, and the end surface of the rear end portion was formed into a flat shape along the entire width thereof without forming an inclined surface, while, at the same time as the second conductive layer was formed, a terminal for connection (41) was provided on the second insulating base layer to fill in the via hole (40) to achieve contact with the first wire, and protrude outwardly in a rectangular shape when viewed in plan view, as shown in FIG. 9. The terminal for connection (41) to be connected to the first wire, and the second wire were both formed on the upper surface of the second insulating base layer.

(Evaluation)

(Molten Solder Dip Test (Thermal Shock Resistance Test))

Ten pieces of the suspension board with circuit of EXAMPLE 1, and ten pieces of the suspension board with circuit of COMPARATIVE EXAMPLE 1 were each dipped once in a molten solder (260±5° C.) for 5 seconds. Then, a rate of resistance change caused by the dipping in the first conductive layer of each of the suspension boards with circuits was measured.

As a result, in EXAMPLE 1, the rate of resistance change was within 0.3% in each of all the ten suspension boards with circuits.

By contrast, in COMPARATIVE EXAMPLE 1, the rates of resistance change were 5% in five of the ten suspension boards with circuits, while the rates of resistance change were within 0.3% in the other five suspension boards with circuits.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
   a wiring formation portion;
   a terminal formation portion; and
   a middle portion formed continuously between the wiring formation portion and the terminal formation portion, wherein
   the wiring formation portion comprises:
   a first insulating layer;
   a first conductive layer formed on the first insulating layer;
   a second insulating layer formed on the first insulating layer so as to cover the first conductive layer; and
   a second conductive layer formed on the second insulating layer so as to overlap the first conductive layer in a thickness direction,
   the terminal formation portion comprises:
   the first conductive layer and the second conductive layer formed in parallel in the same plane, and
   the middle portion comprises:
   the first insulating layer;
   the first conductive layer formed on the first insulating layer;
   the second insulating layer formed on the first insulating layer to cover the first conductive layer, extending from the wiring formation portion toward the terminal formation portion, and terminating at a mid-point between the wiring formation portion and the terminal formation portion; and
   the second conductive layer formed on a portion of the second insulating layer extending from the wiring formation portion to the mid-point, and formed on a portion of the first insulating layer extending from the mid-point to the terminal formation portion.

2. The wired circuit board according to claim 1, wherein, in a portion of the middle portion opposing the second conductive layer, an end surface of the second insulating layer is inclined to be gradually closer to the first insulating layer as it extends from the wiring formation portion toward the terminal formation portion.

3. The wired circuit board according to claim 1, wherein the wired circuit board is a suspension board with circuit.

* * * * *